United States Patent [19]

Apellaniz

[11] 3,881,935

[45] May 6, 1975

[54] PHOTOSENSITIVE POLYMER COMPOSITION

[75] Inventor: Joseph E. Apellaniz, Glen Cove, N.Y.

[73] Assignee: Powers Chemco, Inc., Glen Cove, N.Y.

[22] Filed: June 26, 1973

[21] Appl. No.: 373,617

Related U.S. Application Data

[62] Division of Ser. No. 104,803, Jan. 7, 1971, Pat. No. 3,749,699.

[52] U.S. Cl. ................. 96/115 R; 96/35.1; 96/36.3; 96/36.4; 204/159.18

[51] Int. Cl. .......................... G03c 1/68; G03c 5/00

[58] Field of Search ......... 96/115, 35.1; 204/159.18

[56] References Cited

UNITED STATES PATENTS

| | | | |
|---|---|---|---|
| 2,610,120 | 9/1952 | Minsk | 95/7 |
| 3,257,664 | 6/1966 | Leubnor et al. | 96/115 |
| 3,551,148 | 12/1970 | Faudhaber et al. | 95/115 |
| 3,560,465 | 2/1971 | Reynolds | 260/91.3 |

*Primary Examiner*—Norman G. Torchin
*Assistant Examiner*—J. P. Brammer
*Attorney, Agent, or Firm*—Morgan, Finnegan, Durham & Pine

[57] ABSTRACT

Light-sensitive film forming polymers are disclosed which comprise recurring units of benzoate- and furoate-esterified polyvinyl alcohol as well as their utilization as photographic resist materials and printing plates for lithography.

5 Claims, No Drawings

PHOTOSENSITIVE POLYMER COMPOSITION

This is a division of application Ser. No. 104,803, filed Jan. 7, 1971, now issued U.S. Pat. No. 3,749,699, having the same assignee.

BACKGROUND OF THE INVENTION

This invention relates to light sensitive organic solvent soluble film forming polymers and to a process for producing photographic printing plates and printed circuits utilizing said polymers. More particularly, it relates to light-sensitive polymers which comprise recurring units of benzoate- and furoate-esterified polyvinyl alcohol.

Polymers which contain various esterifying groups have been shown to be sensitive to light, becoming insoluble after sufficient exposure. For example, U.S. Pat. No. 2,610,120 describes how polyvinyl cinnamates can be utilized for making light-sensitive compositions adapted for the production of resist images for printing plates.

It has been found that polyvinyl alcohol esterified partially with a benzoate substituent and partially with a furoate substituent, in which less than 59 percent of the possible —OH groups are esterified with benzoate substituent, results in a light-sensitive polymer having desirable properties not found in the same polymer esterified completely with either one of said esterifying substituents. For instance, the polymer disclosed herein cross-links at a more controllable rate than the corresponding polymer entirely esterified with a cinnamate or furoate moiety. This property is especially desirable for polymers when used for the production of photographic resist images involving a photochemical cross-linking procedure.

SUMMARY OF THE INVENTION

Accordingly, this invention discloses and claims a light-sensitive organic solvent-soluble film-forming polymer capable of forming a continuous coating on a base which comprises recurring units of benzoate- and furoate-esterified polyvinyl alcohol having the structure:

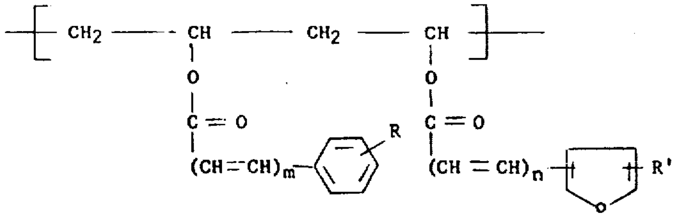

wherein R and R′ are each H, alkyl or alkenyl of up to 12 carbon atoms, aryl, alkaryl or aralkyl of from 6 to 9 carbon atoms, halogen (F, Cl, Br, I), nitro, cyano, hydroxy, acetylamine, amino, alkoxy, carboalkoxy, alkylthio, mono- or di-alkylamine, N-alkyl-carbamyl, N,N-dialkylcarbamyl, alkylsulfonyl, said alkyl groups containing from 1 to 4 carbon atoms, trifluoromethyl, trifluoromethoxy, methoxymethyl, carbamyl, alkanoyloxy containing up to 4 carbon atoms, phenyl, p-chlorophenyl, p-methylphenyl or p-aminophenyl; *m* is a whole number from 0 to 1; and *n* is a whole number from 0 to 1; said polyvinyl alcohol having a molecular weight of from 14,000 to 115,000 and having less than 59 percent of the possible —OH groups esterified with said benzoate moiety.

Particularly preferred is a polymer as described above wherein at least 60 percent of the possible —OH groups on the polyvinyl alcohol molecule are esterified. Another preferred embodiment is a polymer which is esterified with from 10 to about 55 percent of benzoate moiety. Also highly preferred is a polymer as shown which is esterified with from 40 to about 80 percent of furoate substituent. Even more preferred is the polymer which is esterified with 40 to about 45 percent of benzoate and with 30 to about 35 percent with furoate substituent.

Another preferred embodiment of the invention relates to the above described polymers combined with a sensitizing agent, such as a cyclic compound which contains one or more carbonyl groups.

Especially desirable polymers for purposes of this invention include those in which the benzoate substituent is benzoate or cinnamate and the furoate substituent is furoate, 5-methyl-2-furoate or 5-bromo-2-furoate.

Another preferred embodiment of the present invention relates to a process for producing photographic resist images by the photochemical cross-linking of a polymeric material which comprises exposing a photographic element to actinic light through a process transparency wherein said photographic element comprises a support having thereon a photosensitive layer comprising a polymer as shown above whereby in the exposed areas said polymeric material is cross-linked to the insoluble state, and removing the soluble photosensitive material in the unexposed areas, thereby forming a photographic resist image.

It is the purpose of this invention to provide a new class of film forming polymers which are light sensitive. The aforesaid polymers are effectively utilized in the preparation of photographic resist materials, printing plates for lithography, etc.

DETAILED DESCRIPTION OF THE INVENTION

The light sensitive polymeric materials disclosed herein are prepared by an esterification procedure whereby polyvinyl alcohol having a molecular weight of from 14,000 to 115,000 is reacted with a benzoic acid derivative and a furoic acid derivative, resulting in a benzoate- and furoate-esterified polyvinyl alcohol having less than 59 percent of the possible —OH groups esterified with said benzoate moiety.

The synthetic method outlined above may be carried out step-wise in which the intermediate half-ester is isolated prior to effecting final reaction or it may be a continuous process in which the half-ester formed in situ is immediately reacted to provide the final product. Alternatively, the polymer ester can be prepared by copolymerizing the corresponding vinyl esters.

An illustration of the step-wise method is the preparation of polyvinyl-cinnamate furoate. The half-ester polyvinyl cinnamate is first prepared by heating a mixture of polyvinyl alcohol and cinnamoyl chloride at elevated temperatures in a suitable solvent such as N-methyl-2-pyrrolidone. The work-up is typical and consists of diluting the mixture with acetone and then pouring the entire mixture into a large amount of water. The product which precipitates is filtered, washed several times with water and finally air dried. When, in the aforesaid reaction, the mole ratio of polyvinyl alcohol to cinnamoyl chloride is 1:0.5, an analysis indicated the product to contain 42 to 45 percent cinnamate esterification. By regulating the mole ratio of said alcohol and chloride, one is able to prepare a product having a predetermined esterification value. Of course, for purposes of this invention, it will necessarily have less than 59 percent of the possible OH groups on the polyvinyl alcohol esterified with a benzoate moiety.

The term "benzoate moiety" contemplates the esterifying radical one obtains from benzoic acid, substituted benzoic acid, cinnamic acid or substituted cinnamic acid.

It has been found that polyvinyl alcohol having a molecular weight of from about 14,000 to about 115,000 is intended in order to practice the herein disclosed invention. The reasons for this preferred molecular weight range are the following:

The printing speed and acid resistance of a low molecular weight polymer are less than optimum. If the molecular weight is too high, solubility of the unexposed resist will be difficult.

Although N-methyl-2-pyrrolidone is the solvent utilized in the above described reaction, it is possible, and in many instances desirable, to use another solvent or a cosolvent. To be applicable, it must fulfill certain requirements; namely, it must allow dissolution of reagents and it must be nonreactive towards the reagents and reaction products. Many solvents will therefore be suitable and representative examples include hydrocarbons, chlorinated hydrocarbons, ethers, nitrogen containing solvents such as pyridine, etc.

The product which is isolated is in condition for the next step which is conversion to the desired product by a second esterification step in which the remaining hydroxy groups on the polyvinyl alcohol molecule are esterified with the furoate substituent. This is accomplished by heating a mixture of the polyvinyl cinnamate half-ester described above, 2-furoyl chloride and a solvent such as pyridine. The product is obtained in essentially the same manner as described in the preparation of the half-ester. Both steps are generally carried out at temperatures greater than room temperature but usually less than 100°C. It should be understood that these temperatures are not critical and adhere to the general rule in chemistry that reaction rates are aided by increasing the temperature.

Since both steps are esterifications, the well-documented techniques concerning esterification apply and may be used. For instance, although it is preferred to use the acid reactant in the form of its acid chloride, it is possible, although less desirable, to carry out the reaction in the form of the free acid. The latter technique is less preferred because yields are usually lower and reaction conditions must be more closely controlled. The acid can be converted to its acid chloride derivative by treatment with a suitable chlorinating agent such as thionyl chloride or phosphorus trichloride.

With respect to the work-up procedure, it is found that a solvent such as acetone is highly effective in dissolving small amounts of organic impurities and is added for that purpose. Other solvents may serve in that capacity as well. The entire mixture after dilution with acetone is then poured into a large volume of water. The volume of water is not critical and will generally be about two to ten times the volume of the reaction mixture. A large amount is used simply to insure the complete precipitation of desired product.

As indicated, the preparation of esters disclosed herein may also be effected without an intermediate isolation step. For example, a mixture consisting of cinnamoyl chloride, polyvinyl alcohol, benzene and pyridine is refluxed for several hours. After cooling and without isolation of intermediate half-ester, 2-furoyl chloride is added and refluxed again. The work-up consists of stripping the benzene, followed by addition of acetone and then water causing precipitation of the esterified product. In the above described procedure, it may be necessary to filter the filtrate prior to removal of benzene in order to remove a small amount of material of unknown composition which precipitates. Furthermore, in the procedure shown above, when a hydrocarbon cosolvent is used, it is necessary to remove it before work-up commences. The same comments concerning solvent, acid reactant, work-up, etc. provided for the two-step procedure apply to this method as well.

The polymeric materials within the purview of this invention are light-sensitive and are capable of being sensitized to increase their sensitivity to actinic rays. The photosensitive resist solution which consists of the above described polymers dissolved in a solution may be coated on a plate to become a printing member or other etched or plated surface and, after drying and exposure to actinic light, may be developed to remove the unexposed portions of the polymer by dissolving in a suitable organic solvent. Thereafter, the plate may be etched or plated in the conventional manner.

Among the useful volatile organic solvents which contain the polymers described herein include: 1,4-dioxane, methylglycol esters, nitromethane, ethylene dichloride, butyrolactone, diethylene glycol ethers, methylethyl ketone and other organic nonreactive solvents. Many of these same solvents may also be used as a developer.

The sensitizer which can be added to the polymer containing solution contains one or more carbonyl groups. Representative examples include:

4-methyl benzophenone
4,4'-bis-dimethylamino benzophenone
4,4'-bis-diethylamino benzophenone
bis-p-methylstyryl ketone
4-methylumbelliferone
2-methyl-1,4-naphthoquinone
N-methyl-2-quinolone
2-nitrofluorene
3-(2-furyl)acrylophenone
2-furaldoxime
Cholesteryl crotonate
1,2-naphthoquinone
5-phenyl-2,4-pentadienophenone
Benzanthracene-7-12-dione
Benzanthracene-7-one
Benzophenone
Benzil These sensitizers are generally added in amounts of 2.5 to 10 percent by weight based on the weight of the photosensitive polymer.

In order to regulate or control the degree of cross-linking and/or to stabilize the photosensitive polymer over a period of time, an inhibitor may be added. Typical inhibitors include: hydroquinone, m-methoxyphenol, p-methoxyphenol, guiacol, chloranil and 4-t-butylcatechol.

This invention is also concerned with the formation of plates and films derived from the photosensitive mixture of the herein subject polymers and sensitizing agent. The process used makes possible the formation of coated printing films on any substrate by the deposition of the photosensitive mixture using well-known techniques. Typical substrates include metal sheets, e.g., copper, aluminum, zinc, etc., glass, cellulose ester film, polyvinyl acetal film, polystyrene film, polyethylene terephthalate film, etc.

When the support material carrying the photosensitive composition is light-reflecting, there may be present, e.g., superposed on said support and adherent thereto or in the surface thereof, a layer or stratum absorptive of actinic light such as to minimize reflectance from the combined support of incident actinic light.

The plates formed wholly of or coated with the photosensitive composition are useful in photography, photomechanical reproductions, lithography and intaglio printing. More specific examples of such uses are offset printing, silk screen printing, duplicating pads, manifold stencil sheeting coatings, lithographic plates, relief plates, and gravure plates. The term "printing plates" as used in the claims is inclusive of all of these.

They are also of great value in the printed circuit industry, as etching and electroplating resists, and for defining integrated circuit images. Other uses are for chemical machining and for nameplate processes, where metals are removed by etching according to the photographic resist image.

EXAMPLE I

A. Preparation of Polyvinyl Cinnamate half-ester

A mixture of polyvinyl alcohol of molecular weight 86,000 (3.0M) and N-methyl-2-pyrrolidone (2 1.) is heated until a clear solution results.

While maintaining a temperature of about 55°C., cinnamoyl chloride (1.5 M) is added dropwise over a period of 4 hours. The reaction is then diluted with acetone (6000 ml.) and poured into a large amount of water. The cinnamated PVA forms as a white precipitate which is filtered, washed several times (3x) with water and finally air-dried. A volumetric analysis (saponification) shows the product to contain 42–45 percent cinnamate esterification.

B. Preparation of Polyvinylcinnamate furoate

Polyvinyl cinnamate half-ester (3 M) as prepared by procedure A above is dissolved in pyridine (1.5 1.). To this solution is added 2-furoyl chloride (1.5 M) and after completion of addition is maintained at 75°C. for 3–4 hours. The mixed ester product is precipitated as described in procedure A above. After air drying, the yield of product is 85 percent.

EXAMPLE II

Preparation of Polyvinylcinnamate furoate

Cinnamoylchloride (0.5 M) is added to a suspension of PVA (1.0 M) in benzene (1 1.) and pyridine (1 M). The resulting reaction mixture is stirred and refluxed for 3 hours. After cooling to room temperature, 2-furoyl chloride (0.5 M) is added to the reaction mixture and refluxed with stirring for another 3 hours. After filtration to remove the precipitate, the filtrate is stripped free of benzene. A large amount of acetone is added followed by water to cause precipitation of a fibrous white product. Filtration, water washing and air drying provided a substantial yield of product.

EXAMPLE III

A. Preparation of Polyvinylbenzoate half-ester

Benzoyl chloride (0.5 M) is added to a solution of PVA (1 M) and N-methyl-2-pyrrolidone (1 1.). The reaction mixture is heated at 80°C. for 3 hours. Upon cooling and diluting with acetone (3 1.), the mixture is poured into a large volume of water causing precipitation of polyvinyl benzoate. The product is filtered, water washed and air-dried. Saponification analysis indicated 40 percent benzoate esterification.

B. Preparation of Polyvinylbenzoate furoate 2-furoyl chloride (0.5 M) is added to a solution of pyridine (500 ml.) and polyvinylbenzoate half-ester (1.0 M) as prepared in procedure A above and the reaction mixture kept at 55°C. for 4 hours. Upon cooling and dilution with acetone (2 1.), the reaction mixture is poured into a large volume of water. The desired precipitated product is removed by filtration, water-washed and air dried. The product on saponification analysis yields a 30–32 percent furoate esterification value. IR analysis also confirmed the presence of furoate moiety.

EXAMPLE IV

Preparation of Polyvinylbenzoate furoate

To a suspension of PVA (1 M) in benzene (1 1.) and pyridine (1.0 M) is added benzoyl chloride (0.5 M). The reaction mixture is stirred while refluxing for 4 hours. After cooling to room temperature, 2-furoyl chloride (0.5 M) is added and the mixture is refluxed for an additional 4 hours. After filtration and evaporation of benzene, acetone (3 1.) is added. The product is obtained by pouring into a large volume of water, filtering, water washing and air drying.

EXAMPLE V

Preparation of Polyvinylbenzoate 5-bromo-2-furoate

To a solution containing polyvinylbenzoate half-ester (0.5 M) prepared according to the procedure of Example III A and pyridine (1 1.) is added 5-bromo-2-furoyl chloride (0.25 M) and the reaction mixture is stirred and heated at 55°–60°C. for 4 hours. Upon completion, the reaction mixture is diluted with acetone (3 1.), and product is precipitated by pouring into a large volume of water. After filtration, water washing and air drying, product was obtained on 80 percent yield. I.R. analysis confirms the structure.

EXAMPLE VI

Preparation of Polyvinylbenzoate 5-methyl-2-furoate

The procedure of Example V is repeated except 5-methyl-2-furoyl chloride in stoichiometric equivalent amounts, is used in liqu of 5-bromo-2-furoyl chloride. Good yields of product are obtained.

EXAMPLE VII

Preparation of Polyvinylcinnamate 5-bromo-2-furoate

Polyvinylcinnamate half-ester (0.5 M) prepared according to the procedure of Example I A is added to a solution containing 5-bromo-2-furoyl chloride (0.25 M) and pyridine (1 1.) and the reaction mixture is stirred and heated at 55°–60°C. for 4 hours. Upon completion, the reaction mixture is diluted with acetone (3 1.) and product is then precipitated by pouring into a large volume of water. The product is filtered, water washed and air dried to give substantial yields of product.

EXAMPLE VIII

The procedure of Example I A is repeated except that the amount of cinnamoyl chloride used is adjusted to provide half esters having the following % cinnamate esterification values:

58%
50%
47%
40%
35%
30%
20%
10%

EXAMPLE IX

The procedure of Example I A is repeated wherein the following benzoate chlorides, in stoichiometric equivalent amounts, are used in place of cinnamoyl chloride:

p-methylcinnamoyl chloride
p-dodecylcinnamoyl chloride
p-dodecenylcinnamoyl chloride
p-propenylcinnamoyl chloride
p-phenylcinnamoyl chloride
p-methylphenylcinnamoyl chloride
p-phenylethylcinnamoyl chloride
o-chlorocinnamoyl chloride
m-bromocinnamoyl chloride
p-fluorocinnamoyl chloride
p-nitrocinnamoyl chloride
o-hydroxycinnamoyl chloride
m-cyanocinnamoyl chloride
p-acetylaminocinnamoyl chloride
p-aminocinnamoyl chloride
o-dimethylaminocinnamoyl chloride
p-trifluoromethylcinnamoyl chloride
p-trifluoromethoxycinnamoyl chloride
o-methoxycinnamoyl chloride
p-butylaminocinnamoyl chloride
p-acetoxycinnamoyl chloride
p-carbamylcinnamoyl chloride
p-butoxycinnamoyl chloride
p-dimethylcarbamylcinnamoyl chloride
p-propylcarbamylcinnamoyl chloride
p-butylsulfonylcinnamoyl chloride
p-methoxymethylcinnamoyl chloride
p-carbobutoxycinnamoyl chloride
p-phenylcinnamoyl chloride
p-(p-chlorophenyl)cinnamoyl chloride
p-(p-methylphenyl)cinnamoyl chloride
p-(p-aminophenyl)cinnamoyl chloride Corresponding product half-esters are obtained in good yields. The same procedure is carried out except that the corresponding benzoyl-chlorides are used with good results.

EXAMPLE X

The procedure of Example IB is repeated wherein the following furoyl chlorides, in stoichiometric equivalent amounts, are used in place of furoyl chloride:

5-methyl-2-furoyl chloride
5-dodecyl-2-furoyl chloride
5-dodecenyl-2-furoyl chloride
5-propenyl-3-furoyl chloride
5-phenyl-2-furoyl chloride
4-methylphenyl-2-furoyl chloride
5-phenylethyl-2-furoyl chloride
5-chloro-3-furoyl chloride
5-bromo-2-furoyl chloride
5-iodo-2-furoyl chloride
5-fluoro-2-furoyl chloride
5-nitro-2-furoyl chloride
5-hydroxy-2-furoyl chloride
5-cyano-2-furoyl chloride
5-acetylamino-2-furoyl chloride
4-amino-2-furoyl chloride
5-methylthio-2-furoyl chloride
5-dimethylamino-2-furoyl chloride
5-trifluoromethoxy-2-furoyl chloride
5-methoxy-2-furoyl chloride
5-trifluoromethyl-2-furoyl chloride
5-butylamino-2-furoyl chloride
5-trifluoromethylthio-2-furoyl chloride
5-acetoxy-2-furoyl chloride
5-carbamyl-2-furoyl chloride
5-butoxy-2-furoyl chloride
5-dimethylcarbamyl-2-furoyl chloride
5-propylcarbamyl-2-furoyl chloride
5-butylsulfonyl-2-furoyl chloride
5-methoxymethyl-2-furoyl chloride
5-carbobutoxy-2-furoyl chloride
5-phenyl-2-furoyl chloride
5-(2-chlorophenyl)-2-furoyl chloride
5-(2-methylphenyl)-2-furoyl chloride
5-(2-aminophenyl)-2-furoyl chloride Corresponding products are obtained in good yields. The same procedure is carried out except that the corresponding acid chlorides including furan acrylic acid chloride are used and good yields of product are obtained in each instance.

EXAMPLE XI

The procedure of Example I A is repeated wherein polyvinyl alcohols having the following molecular weights are used instead: 14,000 and 115,000

Suitable products are obtained.

EXAMPLE XII

The procedure of Example III is repeated wherein polyvinyl benzoate furoates having the following values are prepared:

| % Total Esterification | % benzoate esterification | % furoate esterification |
|---|---|---|
| 60 | 10 | 50 |
| 70 | 25 | 45 |
| 75 | 30 | 45 |
| 75 | 40 | 35 |
| 80 | 35 | 45 |
| 80 | 45 | 35 |
| 85 | 40 | 45 |
| 90 | 45 | 45 |
| 95 | 50 | 45 |
| 90 | 10 | 80 |
| 100 | 58 | 42 |

EXAMPLE XIII

Photochemical Insolubilization

Polyvinylcinnamate furoate (0.75 g.) as prepared by the procedure of Example I is dissolved in chlorobenzene (10 ml.) containing benzanthracene 7,12-dione (.056 g.). This solution is coated on a copper plate such that after evaporation of the solvent, a layer of about 5 microns in thickness remained.

A negative film transparency is laid upon said layer and exposed for 200 seconds to an 8,000 Watt pulsed Xenon lamp at a distance of 36 inches. The unexposed portions of the layer are removed by washing with a Xylol-methyl cellosolve acetate mixture to yield a relief image.

EXAMPLE XIV

The procedure of Example XIII is repeated except the following sensitizers, in equivalent amounts, are used instead of benzanthracene 7,12-dione with comparable results:

4-methyl benzophenone
4,4'-bis-dimethylamino benzophenone
4,4'-bis-diethylamino benzophenone
bis-p-methylstyryl ketone
4-methylumbelliferone
2-methyl-1,4-naphthoquinone
N-methyl-2-quinolone
2-nitrofluorene
3-(2-furyl)acrylophenone
2-furaldoxime
Cholesteryl crotonate
1,2-naphthoquinone
5-phenyl-2,4-pentadieneophenone
Benzanthracene-7-one

EXAMPLE XV

The procedure of Example XIII is repeated except the following substrates are used in place of copper:

zinc
brass
magnesium
aluminum
steel
ceramic

EXAMPLE XVI

Preparation of Polyvinylbenzoate-2,4,5-trimethyl, 3-furoate

The procedure of Example V is repeated except 2,4,5 trimethyl, 3-furoyl chloride in stoichiometric equivalent amounts, is used in lieu of 5-bromo, 2-furoyl chloride. Good yields of product are obtained.

EXAMPLE XVII

Preparation of Polyvinylcinnamate - 2,4,5-trimethyl 3-furoate

Polyvinylcinnamate half ester (0.5 M) prepared according to the procedure of Example I A is added to a solution containing 2,4,5 trimethyl, 3-furoyl chooride (0.25 M) and pyridine (1 l.) and the reaction mixture is stirred and heated at 55°–60°C. for 4 hours. Upon completion, the reaction mixture is diluted with acetone (3 l.) and the product is then precipitated by pouring into a large volume of water. The precipitate is filtered, water washed and air dried to give substantial yields of product.

EXAMPLE XVIII

A. Preparation of the Copolymer of Vinyl Furoate and Vinyl Cinnamate

Vinyl furoate and vinyl cinnamate monomers were prepared by transesterification of vinyl acetate. Vinyl furoate (100 ml.) and vinyl cinnamate (100 ml.) were dissolved in Xylene (400 ml.). This solution was poured into a pressure-type reaction vessel, and benzoyl peroxide (8 gms.) was added. After purging the system with nitrogen, the bottle was sealed, and heated at 96°C. for 17 hours.

The bottle was allowed to come to room temperature, opened, and the contents were poured into methanol. The copolymer (60 gms.) precipitated out as a white, fibrous resin. This was filtered, further washed with methanol and dried.

B. Photochemical Insolubilization

Poly(vinyl cinnamate-furoate) (0.75 g.) prepared as in A above, was dissolved in chlorobenzene (10 ml.) containing benzanthracene 7,12-dione (0.56 g.). This solution was then coated, exposed, and developed as in Example XIII. A satisfactory resist image was formed.

What is claimed is:

1. A composition consisting essentially of a light-sensitive organic solvent-soluble film-forming polymer capable of forming a continuous coating on a base which comprises recurring units of benzoate- and furoate-esterified polyvinyl alcohol having the structure:

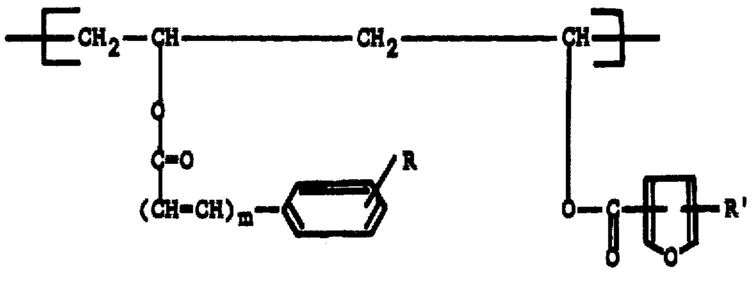

wherein R and R' are each H, alkyl or alkenyl of up to 12 carbon atoms, aryl, alkaryl or aralkyl of from 6 to 9 carbon atoms, halogen (F, Cl, Br, I), nitro, cyano, hydroxy, acetylamino amino alkoxy, carboalkoxy, alkylthio mono- or di-alkylamino, n-alkylcarbamyl, N,N-dialkylcarbamyl, alkylsulfonyl, said alkyl groups containing from 1 to 4 carbon atoms, trifluoromethyl, trifluoromethoxy, trifluoromethylthio, methoxymethyl, carbamyl, alkanoyloxy containing up to 4 carbon atoms, phenyl, p-chlorophenyl, p-methylphenyl or p-aminophenyl; *m* is a whole number from 0 to 1; said polyvinyl alcohol having a molecular weight of from 14,000 to 115,000 and esterified to the extent of from 60 to 100 percent, from 10 to 58 percent thereof comprised of benzoate moiety and a sensitizer therefor.

2. A composition as claimed in claim 1 wherein said sensitizer is a cyclic compound containing one or more carbonyl groups.

3. A process for photochemically cross-linking a light-sensitive organic solvent-soluble film-forming polymer capable of forming a continuous coating on a base which comprises recurring units of benzoate- and furoate-esterified polyvinyl alcohol having the structure:

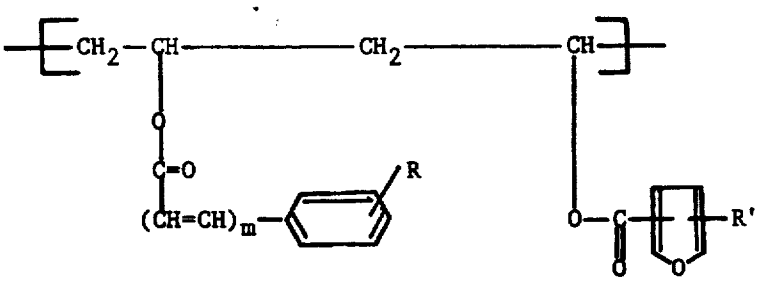

wherein R and R′ are each H, alkyl or alkenyl of up to 12 carbon atoms, aryl, alkaryl or aralkyl of from 6 to 9 carbon atoms, halogen (F, Cl, Br, I), nitro, cyano, hydroxy, acetylamino amino alkoxy, carboalkoxy, alkylthio mono- or di-alkylamino, n-alkylcarbamyl, N,N-dialkylcarbamyl, alkylsulfonyl, said alkyl groups containing from 1 to 4 carbon atoms, trifluoromethyl, trifluoromethoxy, trifluoromethylthio, methoxymethyl, carbamyl, alkanoyloxy containing up to 4 carbon atoms, phenyl, p-chlorophenyl, p-methylphenyl or p-aminophenyl; *m* is a whole number from 0 to 1; said polyvinyl alcohol having a molecular weight of from 14,000 to 115,000 and esterified to the extent of from 60 to 100 percent, from 10 to 58 percent thereof comprised of benzoate moiety which comprises exposing said polymer to actinic light.

4. A process as claimed in claim 3 wherein a sensitizer is combined with said polymer prior to light treatment.

5. A process as claimed in claim 4 wherein said sensitizer is a cyclic compound containing one or more carbonyl groups.

* * * * *